(12) United States Patent
Davidson

(10) Patent No.: US 6,504,413 B1
(45) Date of Patent: Jan. 7, 2003

(54) BUFFER IMPROVEMENT

(75) Inventor: Colin Davidson, Basingstoke (GB)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/813,572

(22) Filed: Mar. 21, 2001

(51) Int. Cl.$^7$ .............................................. H03H 11/26
(52) U.S. Cl. ...................................... 327/261; 327/108
(58) Field of Search ................................ 327/108, 112, 327/261, 264, 276–278, 284, 333, 379, 395, 400; 326/63, 80–83

(56) References Cited

U.S. PATENT DOCUMENTS

| | | | | |
|---|---|---|---|---|
| 5,578,954 A | * | 11/1996 | Rapp | 327/258 |
| 6,005,432 A | * | 12/1999 | Guo et al. | 327/333 |
| 6,043,699 A | * | 3/2000 | Shimizu | 327/333 |
| 6,255,888 B1 | * | 7/2001 | Satomi | 327/333 |
| 6,265,896 B1 | * | 7/2001 | Podlesny et al. | 326/80 |
| 6,184,737 B1 | * | 2/2002 | Taguchi | 327/319 |

* cited by examiner

Primary Examiner—My-Trang Nuton
(74) Attorney, Agent, or Firm—Suiter & Associates PC

(57) ABSTRACT

The present invention is directed to a buffer improvement for higher speed operation. A buffer may include at least two buffer stages, which may include a first buffer stage and a second buffer stage. A voltage conversion circuit is disposed between the first buffer stage and the second buffer stage. The voltage conversion circuit is suitable for acting as a delay between the first buffer stage and the second buffer stage. Additionally, the first buffer stage may be driven directly, thereby increasing buffer speed.

37 Claims, 3 Drawing Sheets

BUFFER IMPROVEMENT

FIELD OF THE INVENTION

The present invention generally relates to the field of buffers, and particularly to a buffer improvement suitable for higher operational speeds.

BACKGROUND OF THE INVENTION

Modern life has made great advances helped through the provision and improvement of electronic devices. From the provision of information handling systems, such as desktop computers, servers, mobile computers, Internet appliances, convergence systems, and the like, to other electronic devices encountered by a user, these devices have a profound effect on most every aspect of a user's life. Competition of manufacturers and assemblers of electronic devices and components has made improvements to the speed and efficiency of these systems desirable to increase both the functionality and competitive advantage of the device.

Improvements to components in an electronic device may be greatly magnified based on a speed-up achieved when multiplied by the massive number of operations performed by electronic devices. For example, buffers, which may include an isolating circuit, often utilizing an amplifier, used to minimize the influence of a driven circuit on a driving circuit, may have a significant propagation delay. This propagation delay was generally necessary to delay turn on and off output buffer stages for noise reduction in the buffer. However, this delay may significantly slow a circuit when the delay is multiplied over the vast number of operations performed utilizing the buffer.

Therefore, it would be desirable to provide a buffer improvement for higher speed operation by decreasing the propagation delay of the circuit.

SUMMARY OF THE INVENTION

Accordingly, the present invention is directed to a buffer improvement for higher speed operation. In a first aspect of the present invention, a buffer includes at least two buffer stages, which may include a first buffer stage and a second buffer stage. A voltage conversion circuit is disposed between the first buffer stage and the second buffer stage. The voltage conversion circuit is suitable for acting as a delay between the first buffer stage and the second buffer stage. In this way, the voltage conversion circuit may be used in place of inter-stage resistors to provide a decrease in the propagation delay of the buffer.

In a second aspect of the present invention, a buffer includes a first buffer stage driven directly from at least one of an internal supply and an external supply. A second buffer stage is also included, with a voltage conversion circuit disposed between the first buffer stage the second buffer stage. The first buffer stage is driven at a first voltage level from the at least one of the internal supply and the external supply, and the second buffer stage is driven at a second voltage level, the second level corresponding to an output of the voltage conversion circuit.

In a third aspect of the present invention, a buffer includes at least two buffer stages, which may include a first buffer stage and a second buffer stage. A means for converting voltage from a first voltage level to a second voltage level is disposed between the first buffer stage and the second buffer stage. The voltage conversion means is suitable for acting as a delay between the first buffer stage and the second buffer stage.

In a fourth aspect of the present invention, a buffer includes a first buffer stage driven direction from at least one of an internal supply and an external supply. A second buffer stage is also included. The first buffer stage is driven at a first voltage level from the at least one of the internal supply and the external supply, and the second buffer stage is driven at a second voltage level.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
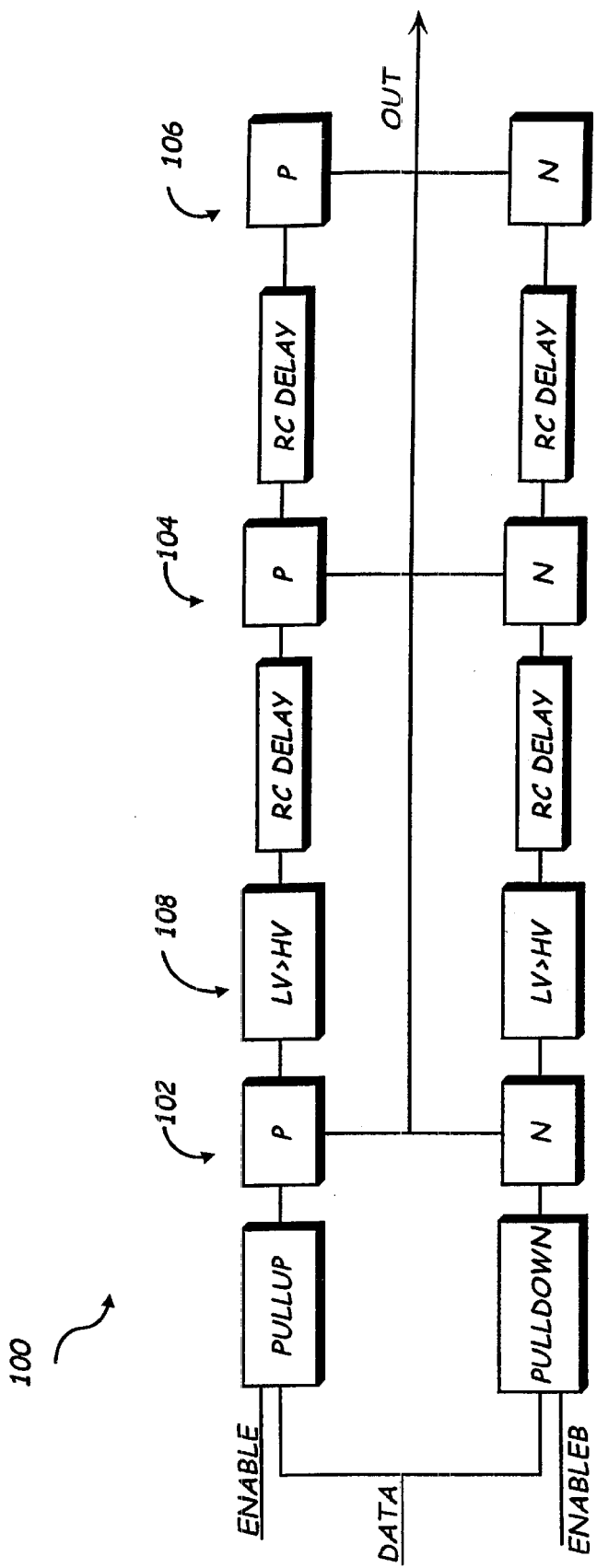
FIG. 1 is a block diagram illustrating an exemplary embodiment of the present invention wherein a buffer is configured for increased speed by utilizing a voltage conversion circuit as a delay.
Figure 2:
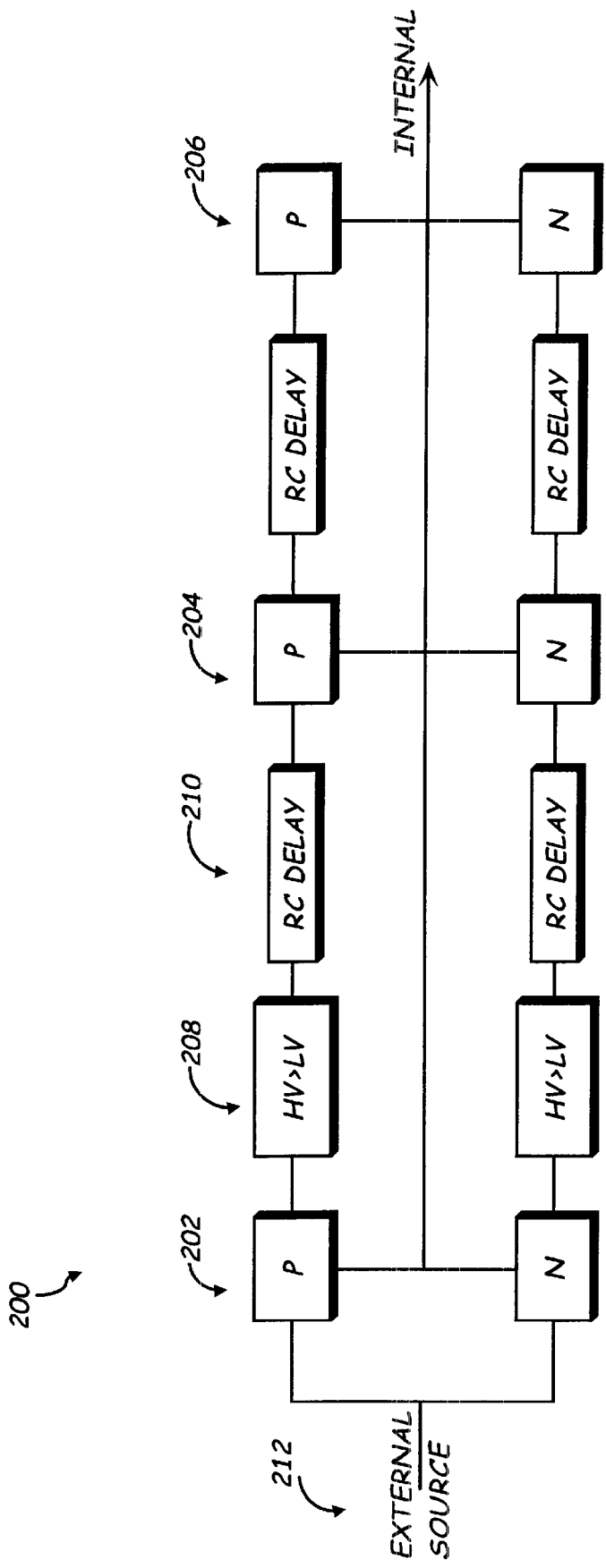
FIG. 2 is a block diagram depicting an exemplary embodiment of the present invention wherein an input buffer is configured for improved speed and efficiency by driving a first stage of the input buffer directly from an external supply.
Figure 3:
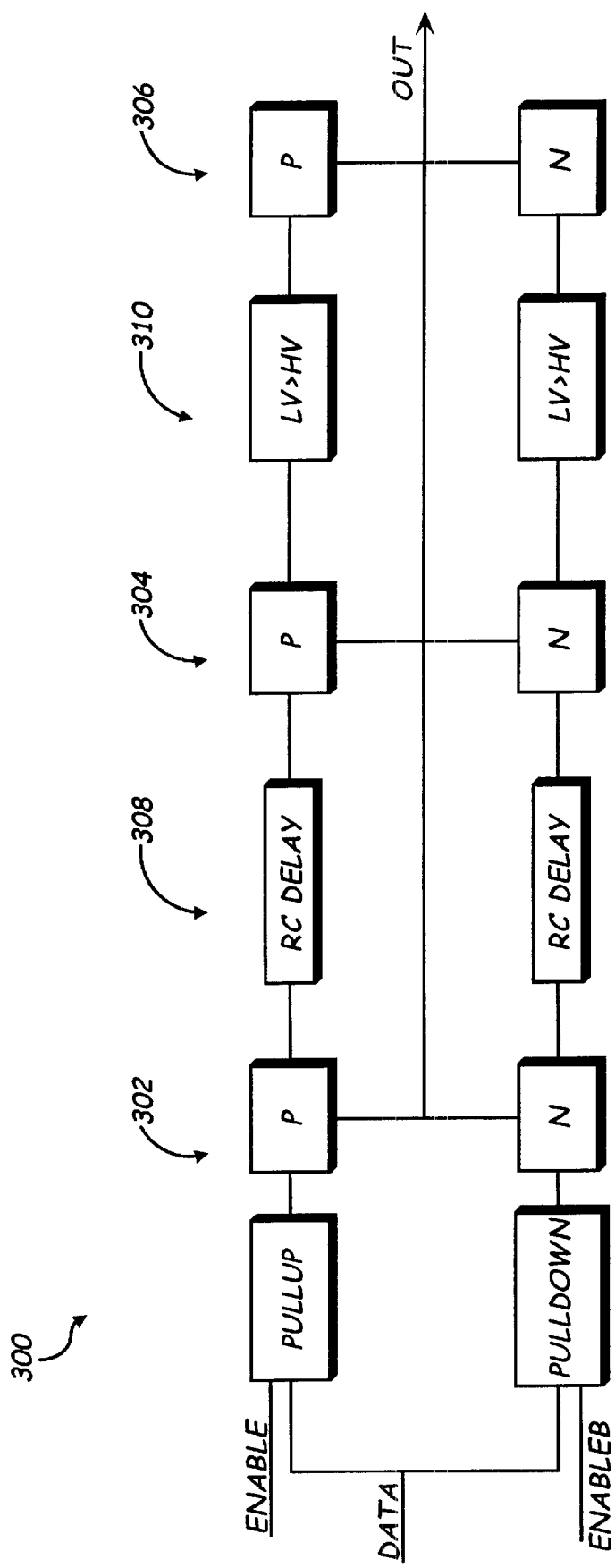
FIG. 3 is a block diagram of an exemplary embodiment of the present invention wherein an output buffer utilizes a voltage conversion circuit between stages to act as a delay to reduce noise.

Referring generally now to FIGS. 1 through 3, exemplary embodiments of the present invention are shown. Buffers, such as an isolating circuit, which may be used to minimize the influence of a driven circuit on a driving circuit, may have a significant propagation delay. Buffers may also utilize an amplifier to increase the voltage level. For example, an output buffer may be utilized to isolate on chip circuits from off chip circuits. The output buffer may also be utilized as an amplifier to increase the voltage level from a lower on chip voltage level, such as 3.0V and lower, to a high voltage level, such as 5.0 V, or any other voltage level higher than the on-chip voltage level suitable for off chip utilization as contemplated by a person of ordinary skill in the art. Previous buffers utilizing a voltage conversion circuit to increase or decrease the voltage level, and then utilized a plurality of stages with delays disposed between the stage to isolate the various stages, thereby decreasing noise. However, the use of the voltage conversion circuit and the various stages and delays results in a significant propagation delay, thereby decreasing the performance of the buffer. Therefore, by turning a first stage on immediately and replacing a delay with a conversion step, rather than waiting to convert, an increase in buffer speed and efficiency may be achieved.

Referring now to FIG. 1, an exemplary embodiment of the present invention is shown wherein a buffer is configured for increased speed by utilizing a voltage conversion circuit as a delay. A buffer 100 is configured as an output buffer suitable for controlling output voltage transition to a level Vref, which may include a reference voltage, a filtered output of an on-chip regulator, and the like. The buffer 100 is configured to include three stages, a first stage 102, a second stage 104 and a third stage 106, although any number of stages may be employed by the present invention without departing from the spirit and scope thereof.

To increase the speed of the buffer 100, the first stage 102 is driven directly from an internal supply. A voltage conversion circuit 108 is disposed between the first stage 102 and the second stage 104 to utilize the inherent delay in the voltage conversion circuit 108 in place of a delay device normally used to delay turn on and off of output buffer stage transistors and the like for noise reduction. Thus, the first stage devices of the buffer may be quickly turned on by being directly driven from logic of the chip, instead of converting the voltage and also utilizing delay devices, such as inter-stage resistors, as delays between the stages. In this way, the buffer may utilize the inherent delay of the voltage conversion circuit to reduce noise between the stages of the buffer.

Although an output buffer is described, a variety of buffers are contemplated by the present invention without departing from the spirit and scope thereof, such as output buffers, input buffers, buffers that raise a voltage from a first lower voltage level to a higher voltage level, buffers that lower a voltage from a first higher voltage level to a lower voltage level, and the like.

Referring now to FIG. 2, an exemplary embodiment of the present invention is shown wherein an input buffer is configured for improved speed and efficiency. A buffer 200 includes a first buffer stage 202, a second buffer stage 204 and a third buffer stage 206. The first buffer stage 202 is driven directly from an external supply for improved response by allowing fast turn-on of the first buffer stage 202 without waiting for voltage conversion as previously required. A voltage conversion circuit 208 is disposed after the first buffer stage 202, the voltage conversion circuit suitable for converting a high voltage, such as 5.0V suitable for off-chip operation, to a low voltage, such as 3.0V and below suitable for on-chip functions. Inherent delay of the voltage conversion circuit 208 is utilized to delay turn on of the second buffer stage 204, such as to adjust internal timings, such as set-up, hold times, and the like. In this way, the present invention provides a reduced circuit area by replace delay devices with HV to LV conversions. If the inherent delay is insufficient, an additional delay device 210 may be added, such as logic gates, RC, R and the like.

The first buffer stage 202 is driven directly from an external supply 212. Thus, the first buffer stage 202 of the buffer 200 may be quickly turned on by being directly driven from the external source 212. The second stage 204 is then delayed by a delay resulting from the voltage conversion circuit 208. Thus, the delay of the voltage conversion circuit 208 may be utilized in place of inter-stage delay devices, such as resistors, previously utilized, thereby resulting in improved efficiency and reduced size of the buffer 200.

Referring now to FIG. 3, an exemplary embodiment of the present invention is shown wherein an output buffer utilizes a voltage conversion circuit between stages to act as a delay to reduce noise. An output buffer 300, configured for isolating on chip circuits from off-chip circuits and amplifying a voltage to a level suitable for off-chip operation includes a first buffer stage 302, a second buffer stage 304 and a third buffer stage 306. The first buffer stage 302 is driven directly from internal logic at a low voltage level utilized internally by the chip to enable the first buffer stage 302 to be initiated immediately. In this way, the first buffer stage 302 is driven directly by a LV circuit, so that the buffering operation is started earlier than would otherwise be the case if a LV to HV conversion was implemented, and then the first stage of the buffer was driven.

A delay device 308 is disposed between the first buffer stage 302 and the second buffer stage 304, such as logic gates, RC, R, inter-stage resistors utilized to delay turn on and off of output buffer stage transistors for noise reduction, adjusting timings, and the like. A voltage conversion circuit 310, in this instance suitable for converting a voltage from a first lower level suitable for use internally in a chip to a second higher level suitable for off-chip use. Delay realized during the voltage conversion process by the voltage conversion circuit 310 is utilized in place of delay devices to reduce noise between the second stage 304 and the third stage 306. It should be apparent that the voltage conversion circuit may be utilized as a delay in a buffer at, after and/or between any stage of a buffer as contemplated by a person of ordinary skill in the art without departing from the spirit and scope thereof.

It is believed that the buffer modification for speed improvement of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A buffer, comprising:
   at least two buffer stages, including a first buffer stage and a second buffer stage; and
   a voltage conversion circuit disposed between the first buffer stage and the second buffer stage, wherein the voltage conversion circuit is suitable for acting as a delay between the first buffer stage and the second buffer stage.

2. The buffer as described in claim 1, wherein the voltage conversion circuit is used in place of at least one of logic gates, RC, R and inter-stage resistors.

3. The buffer as described in claim 1, wherein the voltage conversion circuit is used to delay turn-on of transistors utilized in the buffer stages for at least one of adjusting internal timings, adjusting setup times, adjusting hold times and noise reduction.

4. The buffer as described in claim 1, wherein the first buffer stage is driven directly from at least one of an internal supply and an external supply.

5. The buffer as described in claim 1, further comprising a third buffer stage disposed between the voltage conversion circuit and the second buffer stage and a delay device disposed between the third buffer stage and the second buffer stage.

6. The buffer as described in claim 5, wherein the delay device includes at least one of logic gates, RC, R and inter-stage resistors.

7. The buffer as described in claim 1, further comprising a third buffer stage disposed between the first stage and at least one of an internal supply and an external supply and a delay device disposed between the third buffer stage and the first buffer stage.

8. The buffer as described in claim 1, wherein the first buffer stage is driven at a first voltage level and the second buffer stage is driven at a second voltage level, the second level corresponding to an output of the voltage conversion circuit.

9. The buffer as described in claim 1, wherein the delay is of a sufficient length so as to reduce noise between the first stage and the second stage.

10. The buffer as described in claim 1, further comprising an inter-stage resistor disposed with the voltage conversion circuit so that a delay is achieved, by utilizing the voltage conversion circuit and the inter-stage resistor between the first stage and the second stage, of a sufficient length to reduce noise between the first stage and the second stage.

11. A buffer, comprising:
   a first buffer stage, wherein the first buffer stage is driven directly from at least one of an internal supply and an external supply;
   a second buffer stage; and
   a voltage conversion circuit disposed between the first buffer stage and the second buffer stage, wherein the first buffer stage is driven at a first voltage level from the at least one of the internal supply and the external supply, and the second buffer stage is driven at a second voltage level, the second level corresponding to an output of the voltage conversion circuit.

12. The buffer as described in claim 11, wherein the voltage conversion circuit is used in place of at least one of logic gates, RC, R and inter-stage resistors.

13. The buffer as described in claim 11, wherein the voltage conversion circuit is used to delay turn-on of transistors utilized in the buffer stages for at least one of adjusting internal timings, adjusting setup times, adjusting hold times and noise reduction.

14. The buffer as described in claim 11, wherein the first buffer stage is driven directly from at least one of an internal supply and an external supply.

15. The buffer as described in claim 11, further comprising a third buffer stage disposed between the voltage conversion circuit and the second buffer stage and a delay device disposed between the third buffer stage and the second buffer stage.

16. The buffer as described in claim 15, wherein the delay device includes at least one of logic gates, RC, R and inter-stage resistors.

17. The buffer as described in claim 11, further comprising a third buffer stage disposed between the first stage and at least one of an internal supply and an external supply and a delay device disposed between the third buffer stage and the first buffer stage.

18. The buffer as described in claim 11, wherein the voltage conversion circuit is suitable for acting as a delay between the first buffer stage and the second buffer stage.

19. The buffer as described in claim 11, wherein the delay is of a sufficient length to reduce noise.

20. The buffer as described in claim 11, further comprising an inter-stage resistor disposed with the voltage conversion circuit so that a delay is achieved, by utilizing the voltage conversion circuit and the inter-stage resistor between the first stage and the second stage, of a sufficient length to reduce noise when switching between the first stage and the second stage.

21. A buffer, comprising:
   a first buffer stage, wherein the first buffer stage is driven directly from at least one of an internal supply and an external supply;
   a second buffer stage; and
   a means for converting voltage from a first voltage level to a second voltage level disposed between the first buffer stage and the second buffer stage, wherein the voltage conversion means is suitable for acting as a delay between the first buffer stage and the second buffer stage.

22. The buffer as described in claim 21, wherein the voltage conversion means is used in place of at least one of logic gates, RC, R and inter-stage resistors.

23. The buffer as described in claim 21, wherein the voltage conversion means is used to delay turn-on of transistors utilized in the buffer stages for at least one of adjusting internal timings, adjusting setup times, adjusting hold times and noise reduction.

24. The buffer as described in claim 21, wherein the first buffer stage is driven directly from at least one of an internal supply and an external supply.

25. The buffer as described in claim 21, further comprising a third buffer stage disposed between the voltage conversion means and the second buffer stage and a delay device disposed between the third buffer stage and the second buffer stage.

26. The buffer as described in claim 25, wherein the delay device includes at least one of logic gates, RC, R and inter-stage resistors.

27. The buffer as described in claim 21, further comprising a third buffer stage disposed between the first stage and at least one of an internal supply and an external supply and a delay device disposed between the third buffer stage and the first buffer stage.

28. The buffer as described in claim 21, wherein the first buffer stage is driven at a first voltage level and the second buffer stage is driven at a second voltage level, the second level corresponding to an output of the voltage conversion means.

29. The buffer as described in claim 21, wherein the delay is of a sufficient length to reduce noise.

30. The buffer as described in claim 21, further comprising an inter-stage resistor disposed with the voltage conversion circuit so that a delay is achieved by utilizing the voltage conversion means and the inter-stage resistor between the first stage and the second stage of a sufficient length to reduce noise when switching between the first stage and the second stage.

31. A buffer, comprising:
   a first buffer stage, wherein the first buffer stage is driven directly from at least one of an internal supply and an external supply;
   a second buffer stage; and
   a voltage conversion circuit disposed between the first buffer stage and the second buffer stage;
   wherein the first buffer stage is driven at a first voltage level from the at least one of the internal supply and the external supply, and the second buffer stage is driven at a second voltage level.

32. The buffer as described in claim 31, wherein the voltage conversion circuit is used to delay turn-on of transistors utilized in the buffer stages for at least one of adjusting internal timings, adjusting setup times, adjusting hold times and noise reduction.

33. The buffer as described in claim 31, further comprising a third buffer stage disposed between the voltage conversion circuit and the second buffer stage and a delay device disposed between the third buffer stage and the second buffer stage.

34. The buffer as described in claim 33, wherein the delay device includes at least one of logic gates, RC, R and inter-stage resistors.

35. The buffer as described in claim 31, further comprising a third buffer stage disposed between the first stage and at least one of an internal supply and an external supply and a delay device disposed between the third buffer stage and the first buffer stage.

36. The buffer as described in claim 31, wherein the voltage conversion circuit is suitable for acting as a delay between the first buffer stage and the second buffer stage.

37. The buffer as described in claim 36, wherein the delay is of a sufficient length to reduce noise.

* * * * *